United States Patent
Huang et al.

(10) Patent No.: US 10,355,679 B2
(45) Date of Patent: Jul. 16, 2019

(54) DISPLAY DRIVING CIRCUIT, CALIBRATION MODULE, AND ASSOCIATED CALIBRATION METHOD

(71) Applicant: NOVATEK MICROELECTRONICS CORP., HsinChu (TW)

(72) Inventors: Chien-Chuan Huang, Hsinchu (TW); Chia-Hsin Tung, Hsinchu (TW); Chun-Hung Chen, Yunlin County (TW); Hao-Jan Yang, Zhubei (TW); Chieh-Hsiang Chang, Miaoli County (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/828,618

(22) Filed: Dec. 1, 2017

(65) Prior Publication Data

US 2019/0173457 A1 Jun. 6, 2019

(51) Int. Cl.
*H03K 5/00* (2006.01)
*H03K 5/131* (2014.01)
*H03K 5/135* (2006.01)
*G09G 3/20* (2006.01)
*G09G 5/00* (2006.01)
*G09G 5/18* (2006.01)
*G09F 1/10* (2006.01)
*G06F 1/10* (2006.01)

(52) U.S. Cl.
CPC ....... *H03K 5/00006* (2013.01); *G09G 3/2096* (2013.01); *G09G 5/005* (2013.01); *G09G 5/18* (2013.01); *H03K 5/131* (2013.01); *H03K 5/135* (2013.01); *G06F 1/10* (2013.01)

(58) Field of Classification Search
CPC .... H03K 5/00006; H03K 5/131; H03K 5/135; G09G 3/2096; G09G 3/2092; G09G 5/005
USPC ........................................................ 327/155
See application file for complete search history.

(56) References Cited

U.S. PATENT DOCUMENTS 7,890,787 B2 * 2/2011 Bradley .................... G06F 1/04
                                                          331/18
2018/0131544 A1 * 5/2018 Dicola ............... G01R 29/0273

* cited by examiner

*Primary Examiner* — Patrick C Chen
(74) *Attorney, Agent, or Firm* — McClure, Qualey & Rodack, LLP

(57) ABSTRACT

A display driving circuit, a calibration module, and an associated calibration method are provided. The display driving circuit includes an internal clock circuit and the calibration module. The internal clock circuit generates an internal clock signal. The calibration module includes a counting circuit and a trimming circuit. The counting circuit counts pulses of a reference clock signal to generate a detected reference-clock count and counts pulses of the internal clock signal to generate a detected internal-clock count. The trimming circuit generates a calibration signal to adjust frequency of the internal clock signal when a predefined condition is satisfied. The predefined condition is related to comparison between a first preset count and one of the detected reference-clock count and the detected internal-clock count.

15 Claims, 7 Drawing Sheets

DISPLAY DRIVING CIRCUIT, CALIBRATION MODULE, AND ASSOCIATED CALIBRATION METHOD

TECHNICAL FIELD

The disclosure relates in general to a display driving circuit, a calibration module, and an associated calibration method, and more particularly to a display driving circuit, a calibration module, and an associated calibration method capable of adjusting frequency of an internal clock signal based on a reference clock signal.

BACKGROUND

The Mobile Industry Processor Interface Display Serial Interface (hereinafter, MIPI DSI) protocol standard is related to a high-speed serial interface between a MIPI host and a display panel. Two modes are supported in MIPI DSI, namely, command mode and video mode.

FIG. 1A is a schematic diagram illustrating a display device operating in a video mode. The display device 10a includes a MIPI host 11a and a display panel 13a. The MIPI host 11a includes a frame buffer 111a. The display panel 13a includes a display driving circuit 131a and a panel device 133a, which are electrically connected to each other.

The display driving circuit 131a further includes an internal clock circuit 1311a and a function circuit 1313a capable of providing interface control function of the display device 10a. The function circuit 1313a is electrically connected to the MIPI host 11a, the internal clock circuit 1311a, and the panel device 133a.

For the display device 10a operating in the video mode, the MIPI host 11a and the function circuit 1313a communicate with each other through display data DAT and display commands CMD. Through the display commands CMD, the MIPI host 11a transmits timing related information, for example, the vertical sync signal, the horizontal sync signal and so forth, to the function circuit 1313a.

The function circuit 1313a operates based on an internal clock signal CLKint generated and provided by the internal clock circuit 1311a. The internal clock signal CLKint may be easily affected by environment. In the video mode, the display commands CMD originating from the MIPI host 11a includes timing related information. Therefore, the function circuit 1313a can determine whether the actual frequency of the internal clock signal Fint is matched to a standard frequency of the internal clock signal Fint_std by referring the timing information from the MIPI host 11a.

FIG. 1B is a schematic diagram illustrating a display device operating in a command mode. The display device 10b includes a MIPI host 11b and a display panel 13b. Unlike the MIPI host 11a in FIG. 1A, the MIPI host 11b does not include a frame buffer. The display panel 13b includes a display driving circuit 131b and a smart panel 133b, which are electrically connected to each other. In FIG. 1B, the smart panel 133b further includes a frame buffer 1331b and a panel device 1333b.

Similar to FIG. 1A, the display driving circuit 131b further includes an internal clock circuit 1311b and a function circuit 1313b. The function circuit 1313b is electrically connected to the MIPI host 11a, the internal clock circuit 1311a, and the smart panel 133b. In the command mode, the frame buffer 1331b is not placed in the MIPI host 11b but the smart panel 133b. Unlike the video mode, MIPI host 11a transmits only display refresh signal Sdr to the function circuit 1313b in the command mode. However, the display refresh signal Sdr excludes the timing information and the function circuit 1313b does not have reference for determining frequency precision of the internal clock signal CLKint.

According to MIPI DI standard, the function circuit is required to operate based on a central frequency, and tolerance range is relatively small, for example, +/−1%~+/−2%. However, regardless the video mode and/or the command mode, frequency of the internal clock signal Fint may drift because of temperature change or process variation. Whereas, as shown in FIG. 1B, the internal clock signal CLKint cannot be adjusted when the display device 10b operates in the command mode. Therefore, a mechanism for determining and calibrating frequency of the internal clock signal Fint in the command mode is necessary.

SUMMARY

The disclosure is directed to a display driving circuit, a calibration module, and an associated calibration method. The display driving circuit includes the calibration module to calibrate an internal clock signal. The calibration module generates a calibration signal based on counting pulses of the internal clock signal and pulses of a reference clock signal. With the calibration signal, the display driving circuit is capable of adjusting frequency of the internal clock signal by itself.

According to one embodiment, a display driving circuit is provided. The display driving circuit includes an internal clock circuit and a calibration module. The internal clock circuit generates the internal clock signal. The calibration module includes a counting circuit and a trimming circuit. The counting circuit is electrically connected to the reference clock and the internal clock circuit. The counting circuit counts pulses of the reference clock signal to generate a detected reference-clock count and counts pulses of the internal clock signal to generate a detected internal-clock count. The trimming circuit is electrically connected to the counting circuit, for generating a calibration signal to adjust frequency of the internal clock signal when a predefined condition is satisfied. The predefined condition is related to comparison between a first preset count and one of the detected reference-clock count and the detected internal-clock count.

According to another embodiment, a calibration module is provided. The calibration module receiving a reference clock signal is electrically connected to an internal clock circuit for generating an internal clock signal. The calibration module includes a counting circuit and a trimming circuit. The counting circuit counts pulses of the reference clock signal to generate a detected reference-clock count and counts pulses of the internal clock signal to generate a detected internal-clock count. The trimming circuit is electrically connected to the counting circuit. The trimming circuit generates a calibration signal to adjust frequency of the internal clock signal when a predefined condition is satisfied. The predefined condition is related to comparison between a first preset count and one of the detected reference-clock count and the detected internal-clock count.

According to an alternative embodiment, a calibration method applied to a display driving circuit capable of calibrating an internal clock signal is provided. The calibration method includes following steps. Pulses of reference clock signal are counted to generate a detected reference-clock count, and pulses of the internal clock signal are counted to generate a detected internal-clock count. Whether a predefined condition is satisfied is further determined. The predefined condition is related to comparison between a first preset count and one of the detected reference-clock count and the detected internal-clock count. Consequentially, a calibration signal is generated to adjust frequency of the internal clock signal when the predefined condition is satisfied.

Figure 1A:
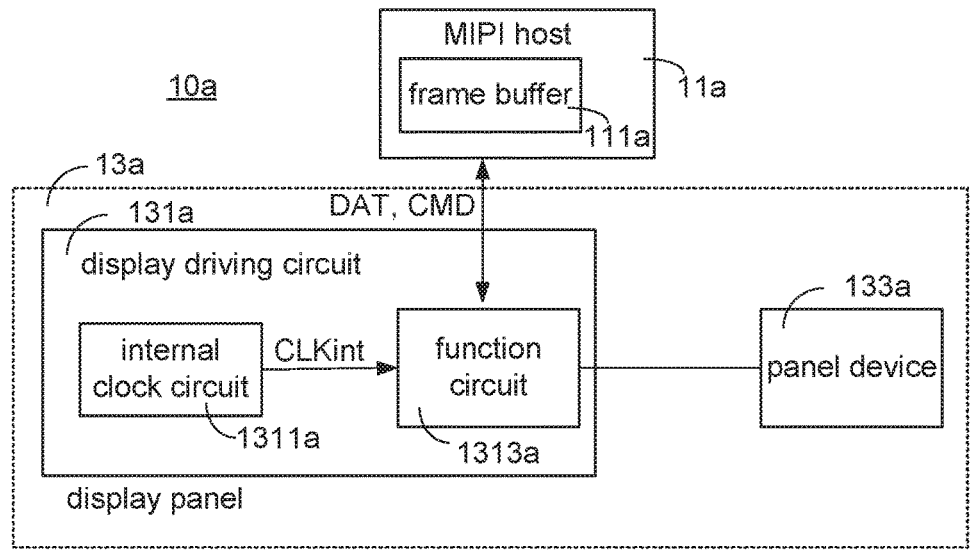
FIG. 1A (prior art) is a schematic diagram illustrating a display device in a video mode.
Figure 1B:
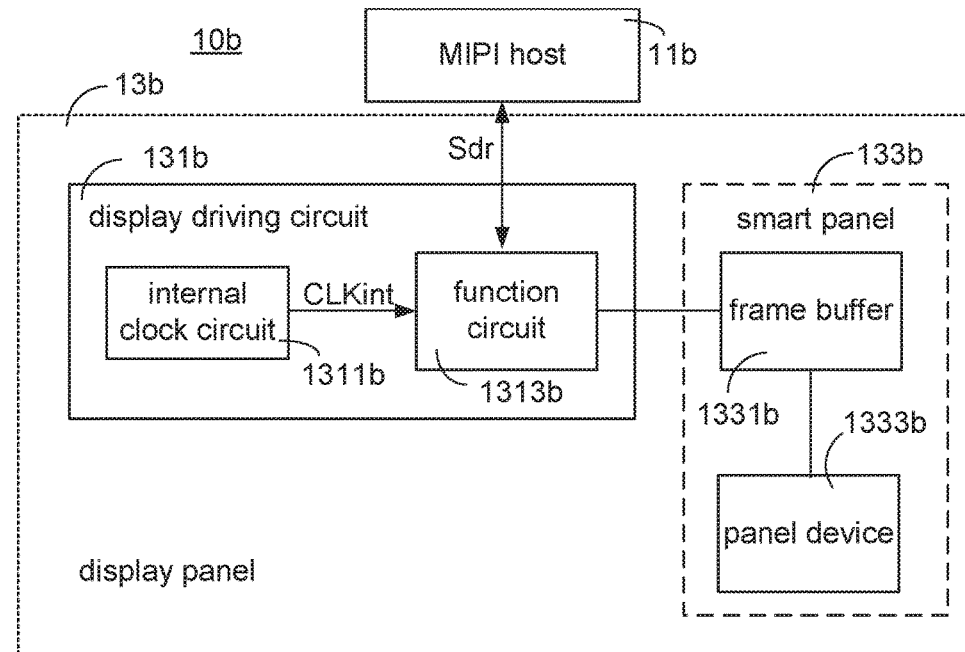
FIG. 1B (prior art) is a schematic diagram illustrating a display device in a command mode.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

As illustrated above, when the display driving circuit operates in the command mode, the display driving circuit does not receive timing related information from the MIPI host. A self-adjustment mechanism being performed by the display driving circuit itself is demonstrated. The calibration method can be applied to the display panel operating in either the video mode or the command mode.

Figure 2A:
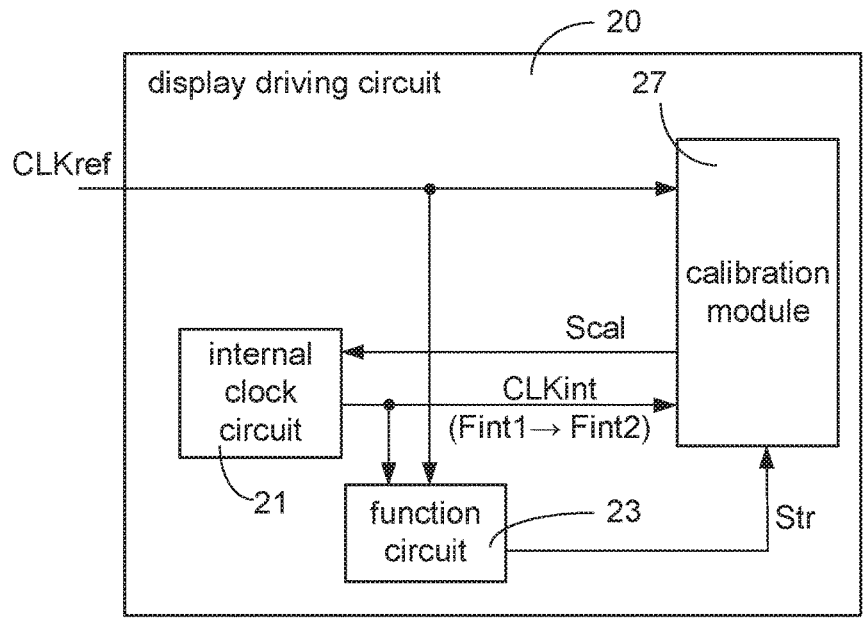
FIG. 2A is a schematic diagram illustrating a display driving circuit according to an embodiment of the present disclosure.

FIG. 2A is a schematic diagram illustrating a display driving circuit according to an embodiment of the present disclosure. The display driving circuit 20 includes an internal clock circuit 21, a function circuit 23 and a calibration module 27, and the display driving circuit 20 receives a reference clock signal CLKref.

The internal clock circuit 21 is an analog circuit for generating oscillation signals. The oscillation signal being generated by the internal clock circuit 21 is defined as an internal clock signal CLKint. Comparing with the internal clock signal CLKint, the reference clock signal CLKref is relatively stable and less affected by temperature change. On the other hand, the internal clock signal CLKint may drift in response to temperature changes. Usually, the frequency of the reference clock signal Fref is lower than the frequency of the internal signal Fint. For example, the frequency of the reference clock signal Fref is 10 Hz, and the frequency of the internal signal Fint is 100 MHz.

Being electrically connected to the internal clock circuit 21, the calibration module 27 receives the internal clock signal CLKint from the internal clock circuit 21. The function circuit 23 also receives the internal clock signal CLKint from the internal clock circuit 21. In short, the reference clock signal CLKref is referred by the calibration module 27 to generate a calibration signal Scal. The calibration signal Scal is utilized to adjust the frequency of the internal clock signal Fint, that is, from an original value Fint1 to an adjusted value Fint2.

After being adjusted by the calibration signal Scal, frequency of the internal clock signal Fint becomes closer to the standard frequency of the internal clock signal Fint_std. The calibration method can be repetitively performed so that the function circuit 23 can operate properly.

Figure 2B:
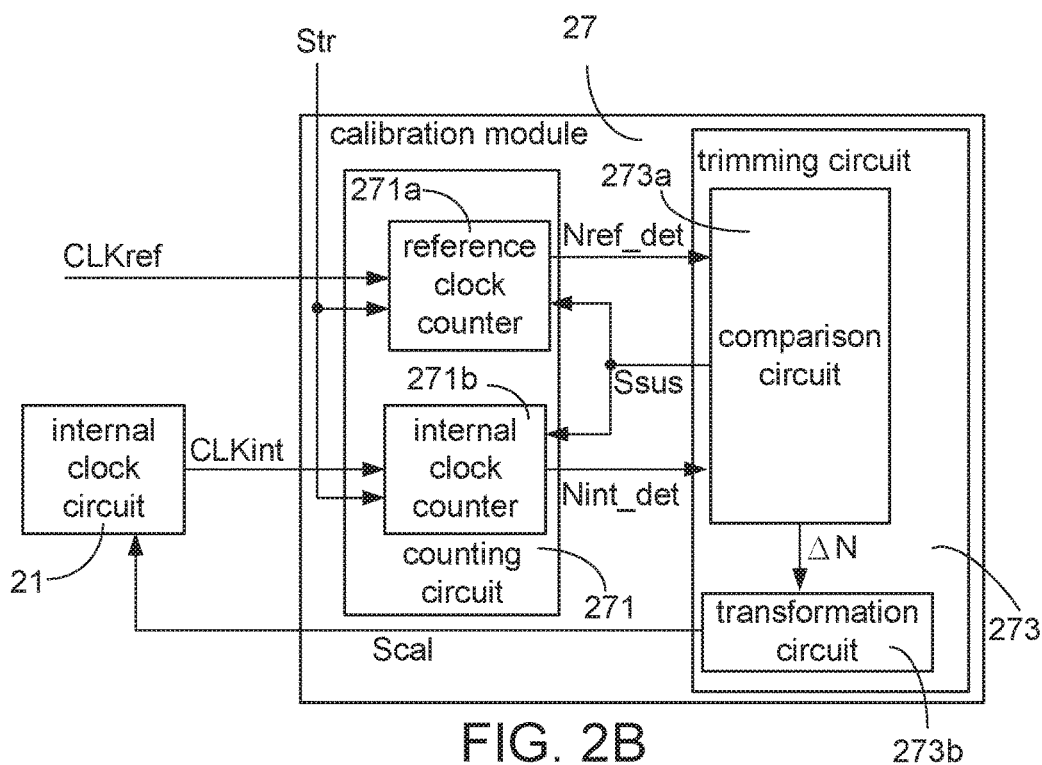
FIG. 2B is a schematic diagram illustrating block diagrams of the calibration module in FIG. 2A.

FIG. 2B is a schematic diagram illustrating block diagrams of the calibration module in FIG. 2A. The calibration module 27 includes a counting circuit 271 and a trimming circuit 273. The counting circuit 271 further includes a reference clock counter 271a and an internal clock counter 271b. The reference clock counter 271a is configured for receiving the reference clock signal CLKref and counting pulses of the reference clock signal CLKref. The internal clock counter 271b is configured for receiving the internal clock signal CLKint and counting pulses of the internal clock signal CLKint.

The reference clock counter 271a and the internal clock counter 271b receive a trigger signal Str simultaneously. The trigger signal Str can be, for example, generated according to a specific command code. As soon as the trigger signal Str is received, the reference clock counter 271a starts and continues to count the pulses of the reference clock signal CLKref, and the internal clock counter 271b starts and continues to count the pulses of the internal clock signal CLKint.

The counting results of the reference clock counter 271a and the internal clock counter 271b are defined as a detected reference-clock count Nref_det and a detected internal-clock count Nint_det, respectively. The comparison circuit 273a receives the detected reference-clock count Nref_det from the reference clock counter 271a, and receives the detected internal-clock count Nint_det from the internal clock counter 271b. When a predefined condition is satisfied, the comparison circuit 273a generates and transmits a suspension signal Ssus to the reference clock counter 271a and the internal clock counter 271b. In addition, the comparison circuit 273a also generates and transmits a counting difference ΔN to the transformation circuit 273b when the predefined condition is satisfied.

Basically, the predefined condition is utilized to determine a counting duration Tcnt, and satisfaction of the predefined condition can be based on the detected reference-clock count Nref_det or the detected internal-clock count Nint_det, depending on different embodiments. Once the counting duration Tcnt is defined, state of the frequency of the internal clock signal Fint can be determined.

After receiving the counting difference ΔN from the comparison circuit 273a, the transformation circuit 273b generates and transmits the calibration signal Scal to the internal clock circuit 21. The calibration signal Scal is used to indicate the internal clock circuit 21 regarding how the frequency of the internal clock signal Fint should be adjusted.

In some applications, the transformation circuit 273b may include a mapping circuit having a lookup table, in which mappings between different values of the counting difference ΔN and different settings of frequency of the internal clock signal Fint are stored. In some applications, the transformation circuit 273b may maintain a hash function so that the settings of the calibration signal Scal corresponding to the counting difference ΔN can be obtained.

In practical applications, selections/sources of the reference clock signal CLKref and the trigger signal Str are not limited. For example, the reference clock signal CLKref can be the MIPI DPHY byte clock or the MIPI CPHY byte clock, and the trigger signal Str can be generated according to the specific command code in the command mode.

The reference clock signal CLKref can be originated from a reference clock circuit, for example, a DPHY or CPHY. In comparison with the internal clock signal CLKint, the reference clock signal CLKref is resistive to temperature change. Therefore, the reference clock signal CLKref can be referred by the trimming circuit 273 to determine state of the frequency of the internal clock signal Fint. That is, whether the actual frequency of the internal clock signal Fint is higher or lower than the standard frequency of the internal clock signal Fint_std can be identified.

Figure 3:
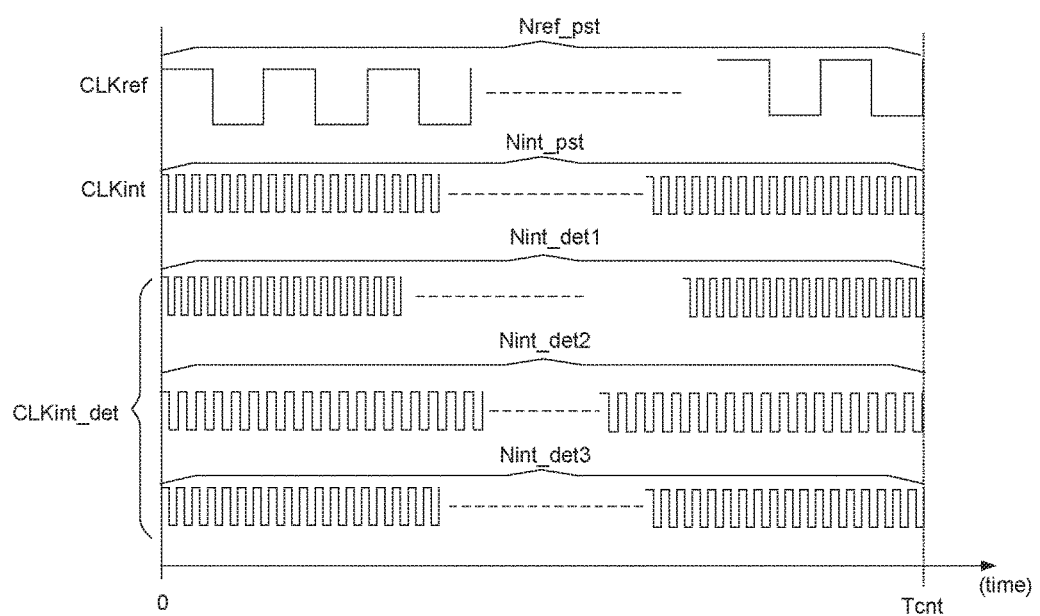
FIG. 3 is a waveform diagram illustrating concept of the calibration method according to an embodiment of the present disclosure.
Figure 4:
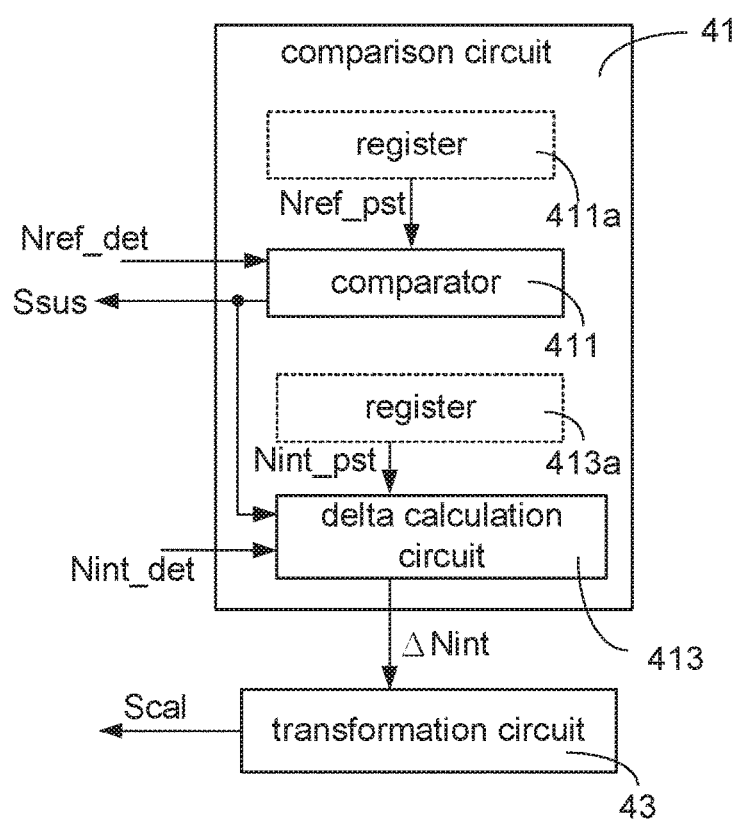
FIG. 4 is a schematic diagram illustrating operations of the trimming circuit according to an embodiment of the present disclosure.
Figure 5:
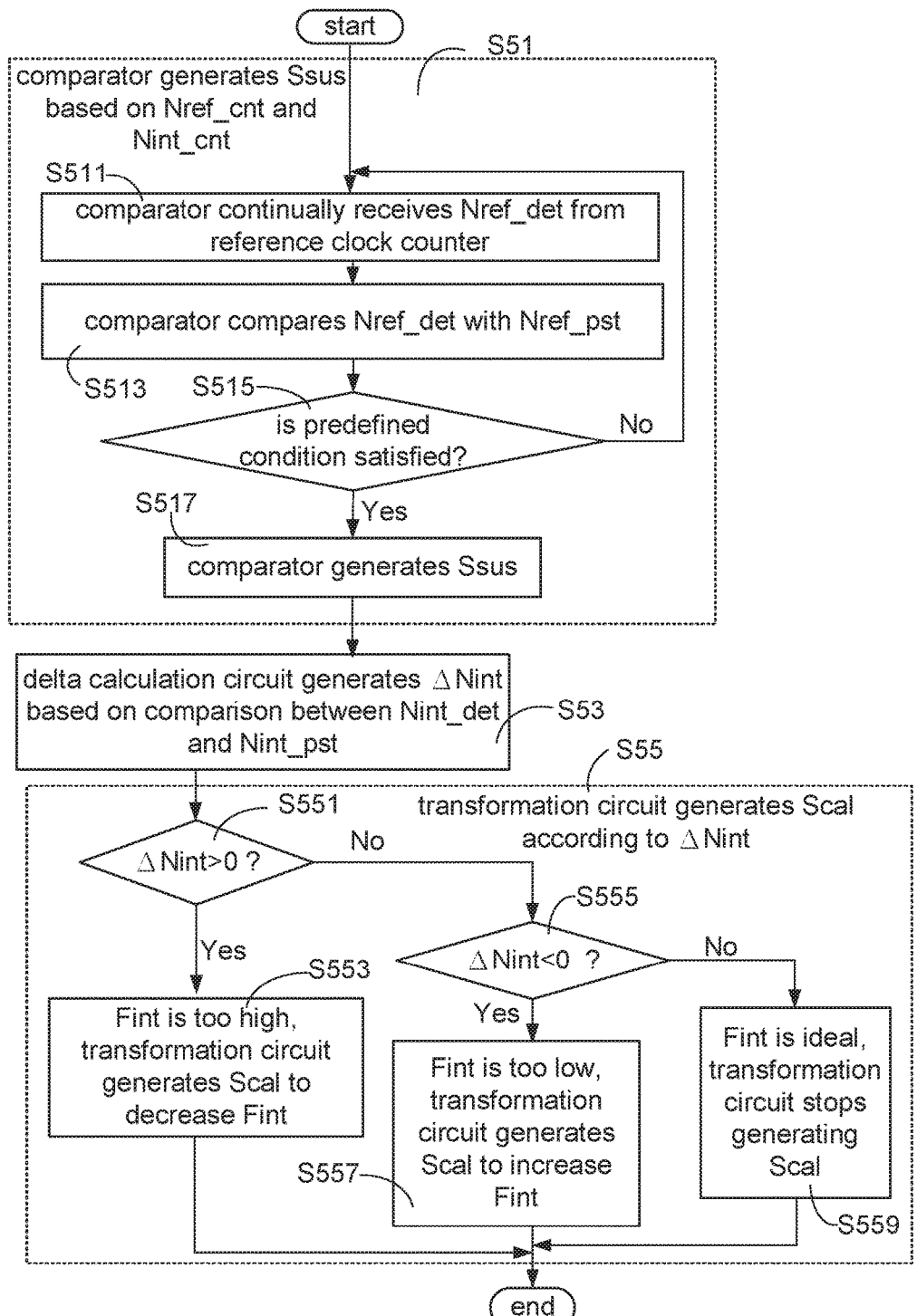
FIG. 5 schematically illustrates a flow diagram regarding operations of the trimming circuit in FIG. 4.
Figure 6:
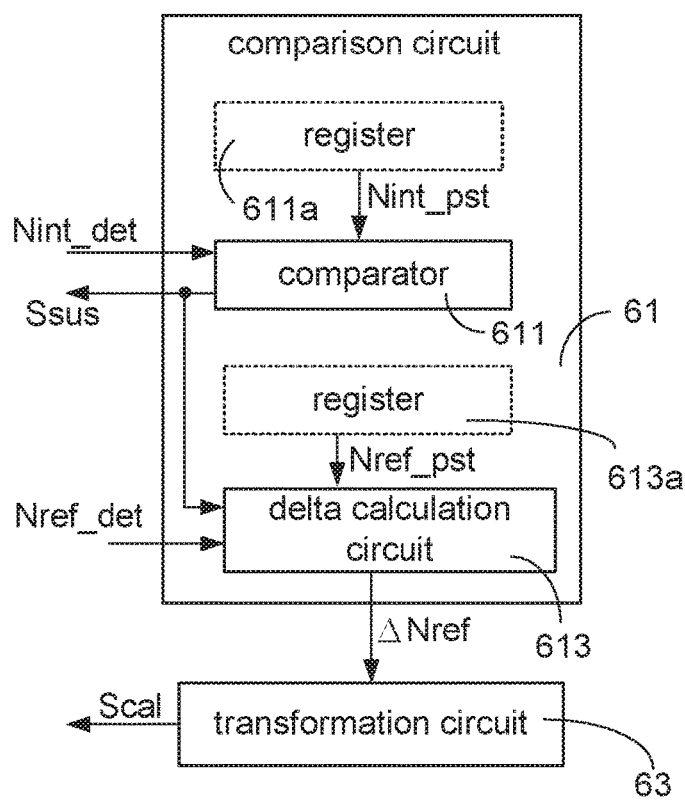
FIG. 6 is a schematic diagram illustrating operations of the trimming circuit according to an embodiment of the present disclosure.
Figure 7:
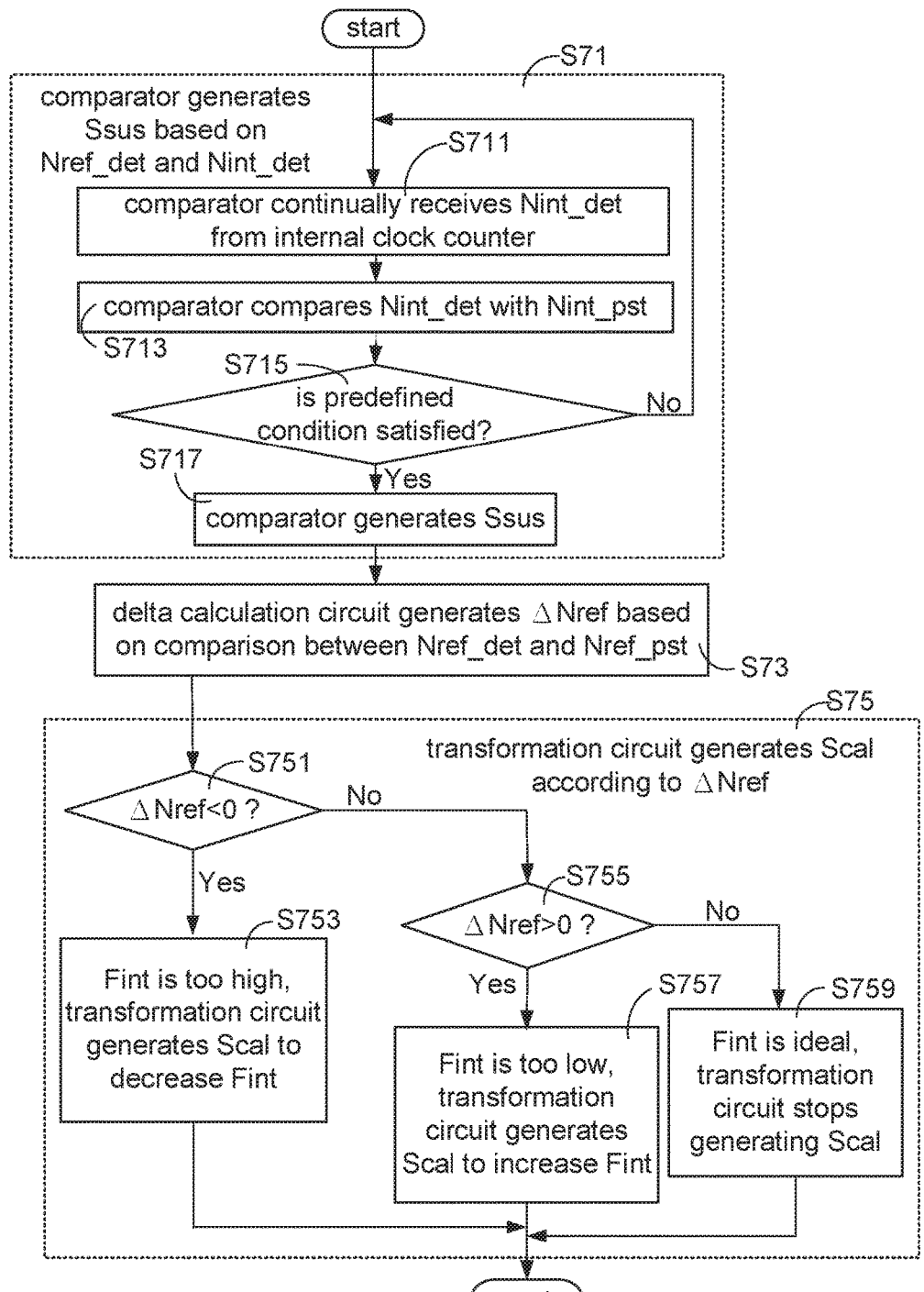
FIG. 7 schematically illustrates a flow diagram regarding operations of the trimming circuit in FIG. 6.

Different mechanisms can be implemented, and two embodiments are shown below. In both embodiments, a preset reference-clock count Nref_pst and a preset internal-clock count Nint_pst are defined. FIGS. 3, 4, and 5 are corresponding to a first embodiment, and FIGS. 6 and 7 are corresponding to a second embodiment.

In FIGS. 3, 4 and 5, the preset reference-clock count Nref_pst is utilized to determine length of the counting duration Tcnt. Based on comparison of the preset internal-clock count Nint_pst and the detected internal-clock count Nint_det which are corresponding to the counting duration Tcnt, state of frequency of the internal clock signal Fint can be determined, and the calibration signal Scal can be generated accordingly.

FIG. 3 is a waveform diagram illustrating concept of the calibration method according to an embodiment of the present disclosure. The first two waveforms in FIG. 3 represent the reference clock signal CLKref and the internal clock signal CLKint having the standard frequency of the internal clock signal Fint_std. The other three waveforms represent different scenarios of the internal clock signal CLKint being detected.

In FIG. 3, the counting duration Tcnt is defined based on a predefined amount of pulses of reference clock signal CLKref, that is, the preset internal-reference count Nref_pst. When the frequency of the internal clock signal Fint matches to the standard frequency of the internal clock signal Fint_std, the counting duration Tcnt is corresponding to a standard or expected pulse amount of the internal clock signal CLKint, that is, the preset internal-clock count Nint_pst.

In FIG. 3, the third waveform represents the scenario that the actual frequency of the internal clock signal Fint being detected is higher than standard frequency of the internal clock signal Fint_std of internal clock signal CLKint. In such case, the detected internal-clock count Nint_det1 is greater than the preset internal-clock count Nref_pst in the counting duration Tcnt. That is, Nint_det1>Nint_pst. Therefore, for the counting duration Tcnt corresponding to the preset reference-clock count Nref_pst, the frequency of the internal clock signal CLKint should be decreased when the detected internal-clock count Nint_det1 is greater than the preset internal-clock count Nref_pst in the counting duration Tcnt.

In FIG. 3, the fourth waveform represents the scenario that the actual frequency of the internal clock signal Fint being detected is lower than the standard frequency of the internal clock signal Fint_std. In such case, the detected internal-clock count Nint_det2 is less than the preset internal-clock count Nref_pst in the counting duration Tcnt. That is, Nint_det2<Nint_pst. Therefore, for the counting duration Tcnt corresponding to the preset reference-clock count Nref_pst, the frequency of the internal clock signal CLKint should be increased when the detected internal-clock count Nint_det2 is less than the preset internal-clock count Nref_pst in the counting duration Tcnt.

In FIG. 3, the fifth waveform represents the scenario that frequency of the internal clock signal Fint being detected is equivalent to the standard frequency of the internal clock signal Fint_std. In such case, the detected internal-clock count Nint_det3 is equivalent to the preset internal-clock count Nref_pst in the counting duration Tcnt. That is, Nint_det3=Nint_pst. Therefore, for the counting duration Tcnt corresponding to the preset reference-clock count Nref_pst, the frequency of the internal clock signal Fint does not need to be adjusted when the detected internal-clock count Nint_det3 is equivalent to the preset internal-clock count Nref_pst in the counting duration Tcnt.

According to FIG. 3, once the counting duration Tcnt is determined based on the preset reference-clock count Nref_pst, the detected internal-clock count Nint_det can reflect the frequency of the internal clock signal CLKint. When the detected internal-clock count Nint_det is more than expected, frequency of the internal clock signal Fint should be lowered. When the detected internal-clock count Nint_det is less than expected, frequency of the internal clock signal Fint should be raised.

FIG. 4 is a schematic diagram illustrating operations of the trimming circuit according to an embodiment of the present disclosure. In FIG. 4, the trimming circuit 40 includes a comparison circuit 41 and a transformation circuit 43. The comparison circuit 41 further includes a comparator 411 and a delta calculation circuit 413.

The comparator 411 is electrically connected to the reference clock counter for receiving the detected reference-clock count Nref_det, and the delta calculation circuit 413 is electrically connected to the internal clock counter 271b for receiving the detected internal-clock count Nint_det. The transformation circuit 43 is electrically connected to the delta calculation circuit 413. The delta calculation circuit 413 generates and transmits the counting difference ΔNint to the transformation circuit 43, and the transformation circuit 43 accordingly generates the calibration signal Scal.

The comparator 411 and the delta calculation circuit 413 may receive the preset number of reference clock Nref_pst and the preset internal-clock count Nint_pst from exterior. Alternatively, the comparison circuit 41 may further include a register 411a for storing the preset reference number Nref_pst and another register 413a for storing the preset internal-clock count Nint_pst. Please refer to FIGS. 4 and 5 together.

FIG. 5 schematically illustrates a flow diagram regarding operations of the trimming circuit in FIG. 4. The operation of the trimming circuit 40 includes following steps.

Firstly, the comparator 411 generates the suspension signal Ssus according to the detected reference-clock count Nref_det and the detected internal-clock count Nint_det (step S51). Step S51 further includes following steps.

The comparator 411 continually receives the detected reference-clock count Nref_det from the reference clock counter (step S511). Then, the comparator 411 compares the detected reference-clock count Nref_det with the preset reference-clock count Nref_pst (step S513).

The comparator 411 determines if the predefined condition is satisfied based on comparison between the detected reference-clock count Nref_det and the preset reference-clock count Nref_pst (step S515). When the detected reference-clock count Nref_det and the preset reference-clock count Nref_pst are equivalent, the predefined condition is determined to be satisfied.

If the determination result of step S515 is negative, step S511 is repeatedly executed. If the determination result of step S515 is positive, the comparator 411 generates the suspension signal Ssus (step S517).

As soon as the suspension signal Ssus is generated, the reference clock counter 271a stops counting the detected reference-clock count Nref_det, and the internal clock counter 271b stops counting the detected internal-clock count Nint_det. Then, the delta calculation circuit 413 receives the detected internal-clock count Nint_det from the internal clock counter 271b. It should be noted that, regardless generation of the suspension signal Ssus, the display driving circuit 20 continuously receives the reference clock signal CLKref, and the internal clock circuit 21 continuously generates the internal clock signal CLKint.

In this embodiment, a duration which starts at the time point the trigger signal Str is received and ends at the time point that the predefined condition is satisfied can be referred as the counting duration Tcnt. As the predefined condition in this embodiment is based on comparison between the detected reference-clock count Nref_det and the preset reference-clock count Nref_pst, the counting duration Tcnt in FIGS. 4 and 5 is related to the reference clock signal CLKref.

Then, the delta calculation circuit 413 generates the counting difference ΔNint based on calculating difference between the detected internal-clock count Nint_det and the preset internal-clock count Nint_pst (step S53). That is, ΔNint=(Nint_det−Nint_pst).

After receiving the counting difference ΔNint, the transformation circuit 43 generates the calibration signal Scal accordingly (step S55). Step S55 further includes following steps.

The transformation circuit 43 determines if the counting difference ΔNint is positive (step S551). In a case that detected internal-clock count Nint_det is greater than the preset internal-clock count Nint_pst, the counting difference ΔNint is positive. This implies that frequency of the internal clock signal Fint is too high (as the third waveform shown in FIG. 3). Therefore, the transformation circuit 43 generates the calibration signal Scal to decrease the frequency of the internal clock signal Fint (step S553).

If the counting difference ΔNint is not positive, the transformation circuit 43 further determines if the counting difference ΔNint is negative (step S555). In a case that detected internal-clock count Nint_det is less than the preset internal-clock count Nint_pst, the counting difference ΔNint is negative. This implies that frequency of the internal clock signal Fint is too low (as the fourth waveform shown in FIG. 3). Therefore, the transformation circuit 43 generates the calibration signal Scal to increase frequency of the internal clock signal Fint (step S557).

If the determination result of step S555 is negative, the counting difference ΔNint is "zero", and the detected internal-clock count Nint_det is equivalent to the preset internal-clock count Nint_pst. This implies that the frequency of the internal clock signal Fint is equivalent to the standard frequency of the internal clock signal Fint_std. In such case, the transformation circuit 43 stops generating the calibration signal Scal to the internal clock circuit 21 (step S559).

According to the first embodiment of the present disclosure, the detected reference-clock count Nref_det and the preset reference-clock count Nref_pst are utilized to determine satisfaction of the predefined condition and generation of the suspension signal Ssus. On the other hand, the detected internal-clock count Nint_det and the preset internal-clock count Nint_pst are utilized to calculate the counting difference Δ Nint and to generate the calibration signal Scal.

In FIGS. 6 and 7, the preset internal-clock count Nrint_pst is utilized to determine length of the counting duration Tcnt. Based on comparison of the preset reference-clock count Nref_pst and the detected reference-clock count Nref_det which are corresponding to the counting duration Tcnt, state of the frequency of the internal clock signal Fint can be determined, and the calibration signal Scal can be generated accordingly.

FIG. 6 is a schematic diagram illustrating operations of the trimming circuit according to an embodiment of the present disclosure. As shown in FIG. 6, the trimming circuit 60 includes a comparison circuit 61 and a transformation circuit 63. The comparison circuit 61 further includes a comparator 611 and a delta calculation circuit 613.

The comparator 611 is electrically connected to the internal clock counter 271b for receiving the detected internal-clock count Nint_det, and the delta calculation circuit 613 is electrically connected to the reference clock counter 271a for receiving the detected reference-clock count Nref_det. The transformation circuit 63 is electrically connected to the delta calculation circuit 613. The delta calculation circuit 613 generates and transmits the counting difference ΔNref to the transformation circuit 63, and the transformation circuit 63 accordingly generates the calibration signal Scal.

The comparator 611 and the delta calculation circuit 613 may receive the preset internal-clock count Nint_pst and the preset reference-clock count Nref_pst from exterior. Alternatively, the comparison circuit 61 may further include a register 611a for storing the preset internal-clock count Nint_pst and another register 613a for storing the preset reference number Nref_pst. Please refer to FIGS. 6 and 7 together.

FIG. 7 schematically illustrates a flow diagram regarding operations of the trimming circuit in FIG. 6. The operation of the trimming circuit 60 includes following steps.

Firstly, the comparator 611 generates the suspension signal Ssus according to the detected reference-clock count Nref_det and the detected internal-clock count Nint_det (step S51). Step S51 further includes following steps.

The comparator 611 continually receives the detected internal-clock count Nint_det from the internal clock counter 271b (step S711). Then, the comparator 711 compares the detected internal-clock count Nint_det with the preset internal-clock count Nint_pst (step S713).

The comparator 611 determines if the predefined condition is satisfied based on comparison between the detected internal-clock count Nint_det and the preset internal-clock count Nint_pst (step S715). When the detected internal-clock count Nint_det and the preset internal-clock count Nint_pst are equivalent, the predefined condition is determined to be satisfied.

If the determination result of step S715 is negative, step S711 is repeatedly executed. If the determination result of step S715 is positive, the comparator 611 generates the suspension signal Ssus (step S717).

As soon as the suspension signal Ssus is generated, the reference clock counter 271a stops counting the detected reference-clock count Nref_det, and the internal clock counter 271*b* stops counting the detected internal-clock count Nint_det. Then, the delta calculation circuit 613 receives the detected reference-clock count Nref_det from the reference clock counter 271*a*. It should be noted that, regardless generation of the suspension signal Ssus, the display driving circuit 20 continuously receives the reference clock signal CLKref, and the internal clock circuit 21 continuously generates the internal clock signal CLKint.

In this embodiment, a duration which starts at the time point the trigger signal Str is received and ends at the time point that the predefined condition is satisfied can be referred as the counting duration Tcnt. As the predefined condition in this embodiment is based on comparison between the detected internal-clock count Nint_det and the preset internal-clock count Nint_pst, the counting duration Tcnt in FIGS. 6 and 7 is related to the internal clock signal CLKint.

Then, the delta calculation circuit 613 generates the counting difference ΔNref based on calculating difference between the detected reference-clock count Nref_det and the preset reference-clock count Nref_pst (step S73). That is, ΔNref=(Nref_det−Nref_pst).

After receiving the counting difference ΔNref, the transformation circuit 63 generates the calibration signal Scal accordingly (step S75). Step S75 further includes following steps.

The transformation circuit 63 determines if the counting difference ΔNref is negative (step S751). In a case that detected reference-clock count Nref_det is less than the preset reference-clock count Nreft_pst, the counting difference ΔNref is negative. The negative value of the counting difference ΔNref implies that a longer counting duration Tcnt is required to generate the detected reference-clock count Nref_det. In other words, the internal clock circuit 21 needs a longer counting duration Tcnt to generate the same amount (as the preset internal-clock count Nint_pst) of pulses of the internal clock signal CLKint. This implies frequency of the internal clock signal Fint is too high. Therefore, the transformation circuit 63 generates the calibration signal Scal to decrease frequency of the internal clock signal Fint (step S753).

If the counting difference ΔNref is not negative, the transformation circuit 63 further determines if the counting difference ΔNref is positive (step S755). In a case that detected reference-clock count Nref_det is greater than the preset reference-clock count Nref_pst, the counting difference ΔNref is positive. The positive value of the counting difference ΔNref implies that a shorter counting duration Tcnt is required to generate the detected reference-clock count Nref_det. In other words, the internal clock circuit 21 needs a shorter counting duration Tcnt to generate the same amount (as the preset internal-clock count Nint_pst) of pulses of the internal clock signal CLKint. This implies that frequency of the internal clock signal Fint is too low. Therefore, the transformation circuit 63 generates the calibration signal Scal to increase frequency of the internal clock signal Fint (step 757).

If the determination result of step S755 is negative, the counting difference ΔNref is "zero", and the detected reference-clock count Nref_det is equivalent to the preset reference-clock count Nref_pst. This implies that frequency of the internal clock signal Fint is equivalent to the standard frequency of the internal clock signal Fint_std. In such case, the transformation circuit 63 stops generating the calibration signal Scal to the internal clock circuit 21 (step S759).

According to the second embodiment of the present disclosure, the detected internal-clock count Nint_det and the preset internal-clock count Nint_pst are utilized to determine satisfaction of the predefined condition and generation of the suspension signal Ssus. On the other hand, the detected reference-clock count Nref_det and the preset reference-clock count Nref_pst are utilized to calculate the counting difference ΔNref and to generate the calibration signal Scal.

The embodiments of the present disclosure can compensate frequency drift of the internal clock signal CLKint, regardless of the cause of the drift. These embodiments provide a trimming function capable of adjusting frequency of the internal clock signal Fint based on an internal mechanism. With the self-adjustment mechanism, the display driving circuit in the video mode and/or the command model can determine and adjust frequency precision of the internal clock signal CLKint automatically. Furthermore, values of the frequency of the reference clock signal Fref and the frequency of the internal clock signal Fint are not limited.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A display driving circuit, comprising:
   an internal clock circuit, for generating an internal clock signal; and
   a calibration module, comprising:
   a counting circuit, electrically connected to the internal clock circuit, for counting pulses of a reference clock signal to generate a detected reference-clock count and counting pulses of the internal clock signal to generate a detected internal-clock count; and
   a trimming circuit, electrically connected to the counting circuit, comprising:
   a comparison circuit, comprising:
   a comparator, electrically connected to the counting circuit, for receiving a first preset count and one of the detected reference-clock count and the detected internal-clock count, and generating a suspension signal when determining the first preset count is equivalent to the one of the detected reference-clock count and the detected internal-clock count; and
   a delta calculation circuit, electrically connected to the comparator, for receiving the suspension signal, a second preset count, and the other one of the detected reference-clock count and the detected internal-clock count, wherein the delta calculation circuit generates a counting difference based on the other one of the detected reference-clock count and the detected internal-clock count and the second preset count when the suspension signal is received; and
   a transformation circuit, electrically connected to the delta calculation circuit and the internal clock circuit, for generating a calibration signal to adjust frequency of the internal clock signal based on the counting difference.

2. The display driving circuit according to claim 1, wherein
   the counting circuit starts counting the pulses of the reference clock signal and the internal clock signal when a trigger signal is received.

3. The display driving circuit according to claim 1, wherein the counting circuit comprises:
   a reference clock counter, electrically connected to the trimming circuit, for receiving the reference clock signal, generating and transmitting the detected reference-clock count to the trimming circuit, and receiving the suspension signal from the trimming circuit; and an internal clock counter, electrically connected to the internal clock circuit and the trimming circuit, for receiving the internal clock signal from the internal clock circuit, generating and transmitting the detected internal-clock count to the trimming circuit, and receiving the suspension signal from the trimming circuit.

4. The display driving circuit according to claim 1, wherein
the first preset count is a preset reference-clock count and the second preset count is a preset internal-clock count, wherein
the comparator generates the suspension signal when the preset reference-clock count is equivalent to the detected reference-clock count, and
the delta calculation circuit calculates difference between the detected internal-clock count and the preset internal-clock count to generate the counting difference.

5. The display driving circuit according to claim 4, wherein
the transformation circuit generates the calibration signal to decrease the frequency of the internal clock signal if the counting difference represents that the detected internal-clock count is greater than the preset internal-clock count; or
the transformation circuit generates the calibration signal to increase the frequency of the internal clock signal if the counting difference represents that the detected internal-clock count is less than the preset internal-clock count.

6. The display driving circuit according to claim 1, wherein
the first preset count is a preset internal-clock count and the second preset count is a preset reference-clock count, wherein
the comparator generates the suspension signal when the preset internal-clock count is equivalent to the detected internal-clock count, and
the delta calculation circuit calculates difference between the detected reference-clock count and the preset reference-clock count to generate the counting difference.

7. The display driving circuit according to claim 6, wherein
the transformation circuit generates the calibration signal to decrease the frequency of the internal clock signal if the counting difference represents that the detected reference-clock count is less than the preset reference-clock count; or
the transformation circuit generates the calibration signal to increase the frequency of the internal clock signal if the counting difference represents that the detected reference-clock count is greater than the preset reference-clock count.

8. The display driving circuit according to claim 1, wherein the comparison circuit further comprises:
a first register, electrically connected to the comparator, for providing the first preset count; and
a second register, electrically connected to the delta calculation circuit, for providing the second preset count.

9. A calibration module receiving a reference clock signal and an internal clock signal, comprising:
a counting circuit, for counting pulses of the reference clock signal to generate a detected reference-clock count and counting pulses of the internal clock signal to generate a detected internal-clock count; and
a trimming circuit, comprising:
a comparison circuit, comprising:
a comparator, electrically connected to the counting circuit, for receiving a first preset count and one of the detected reference-clock count and the detected internal-clock count, and generating a suspension signal when determining the first preset count is equivalent to the one of the detected reference-clock count and the detected internal-clock count; and
a delta calculation circuit, electrically connected to the comparator, for receiving the suspension signal, a second preset count, and the other one of the detected reference-clock count and the detected internal-clock count, wherein the delta calculation circuit generates a counting difference based on the other one of the detected reference-clock count and the detected internal-clock count and the second preset count when the suspension signal is received; and
a transformation circuit, electrically connected to the delta calculation circuit and the internal clock circuit, for generating a calibration signal to adjust frequency of the internal clock signal based on the counting difference.

10. A calibration method applied to a display driving circuit capable of calibrating an internal clock signal, comprises steps of:
receiving a reference clock signal;
counting pulses of the reference clock signal to generate a detected reference-clock count;
counting pulses of the internal clock signal to generate a detected internal-clock count;
generating a suspension signal to stop generating the detected reference-clock count and the detected internal-clock count when a first preset count is equivalent to the one of the detected reference-clock count and the detected internal-clock count;
generating a counting difference based on the other one of the detected reference-clock count and the detected internal-clock count and a second preset count when the suspension signal is generated; and
generating a calibration signal to adjust frequency of the internal clock signal based on the counting difference.

11. The calibration method according to claim 10, further comprising a step of:
receiving a trigger signal, wherein the pulses of the reference clock signal and the internal clock signal start to be counted after the trigger signal is received.

12. The calibration method according to claim 10, wherein
the first preset count is a preset reference-clock count and the second preset count is a preset internal-clock count, and
the suspension signal is generated when the preset reference-clock count is equivalent to the detected reference-clock count.

13. The calibration method according to claim 12, further comprising a step of:
calculating difference between the detected internal-clock count and the preset internal-clock count to generate the counting difference, wherein
the frequency of the internal clock signal is decreased according to the calibration signal if the counting difference represents that the detected internal-clock count is greater than the preset internal-clock count; or the frequency of the internal clock signal is increased according to the calibration signal if the counting difference represents that the detected internal-clock count is less than the preset internal-clock count.

14. The calibration method according to claim 10, wherein
the first preset count is a preset internal-clock count and the second preset count is a preset reference-clock count, and
the suspension signal is generated when the preset internal-clock count is equivalent to the detected internal-clock count.

15. The calibration method according to claim 14, further comprising a step of:
calculating difference between the detected reference-clock count and the preset reference-clock count to generate the counting difference, wherein
the frequency of the internal clock signal is decreased according to the calibration signal if the counting difference represents that the detected reference-clock count is less than the preset reference-clock count; or
the frequency of the internal clock signal is increased according to the calibration signal if the counting difference represents that the detected reference-clock count is greater than the preset reference-clock count.

* * * * *